US006728131B2

(12) United States Patent
Ustinov

(10) Patent No.: US 6,728,131 B2
(45) Date of Patent: Apr. 27, 2004

(54) FLUXON INJECTION INTO ANNULAR JOSEPHSON JUNCTIONS

(75) Inventor: Alexey V. Ustinov, Effeltrich (DE)

(73) Assignee: D-Wave Systems, Inc., Vancouver (CA)

( * ) Notice: Subject to any disclaimer, the term of this patent is extended or adjusted under 35 U.S.C. 154(b) by 0 days.

(21) Appl. No.: 10/117,696

(22) Filed: Apr. 4, 2002

(65) Prior Publication Data

US 2002/0177529 A1 Nov. 28, 2002

Related U.S. Application Data

(60) Provisional application No. 60/283,477, filed on Apr. 11, 2001.

(51) Int. Cl.[7] .............................................. G11C 11/44
(52) U.S. Cl. .......................... 365/162; 257/31; 257/36
(58) Field of Search ............................... 365/162, 160, 365/161; 257/31, 34, 36; 505/190

(56) References Cited

U.S. PATENT DOCUMENTS

| 3,936,677 A | | 2/1976 | Fulton et al. ................ 327/528 |
| 4,181,902 A | * | 1/1980 | Scott ....................... 331/107 S |
| 4,749,888 A | | 6/1988 | Sakai et al. ..................... 326/4 |
| 5,323,344 A | | 6/1994 | Katayama et al. .......... 365/162 |
| 5,683,967 A | | 11/1997 | Frenkel ..................... 5805/320 |
| 6,331,805 B1 | | 12/2001 | Gupta et al. ............. 331/107 S |
| 6,442,805 B2 | * | 9/2002 | Pfister .......................... 24/514 |

FOREIGN PATENT DOCUMENTS

| JP | 60170275 | 9/1985 | |
| JP | 5190922 A2 | 7/1993 | ........... H01L/39/22 |
| WO | WO 02/15290 A1 | 2/2002 | ........... H01L/39/22 |

OTHER PUBLICATIONS

L. G. Aslamazov and E. V. Gurovich, Pis'ma Zh. Eksp. Teor. Fiz. 40, 22 (1984) [Soviet Physics JETP Letters 49, 746 (1984)].
F. Benatti, et al., "Testing Macroscopic Quantum Coherence", IL Nuovo Cimento B 110, N. 5–6, pp. 593–610 (Jan. 19, 1995).
M. Bocko, et al., "Prospects for quantum coherent computation using superconducting electronics", IEEE Transactions on Applied Superconductivity 7, 3638 (Jun. 1, 1997).
J. Caputo, "Effect of geometry on fluxon width in a Josephson junction", International Journal of Modern Physics C 7(2), 191 (996).
G. Carapella, "Relativistic flux quantum in a field–induced deterministic ratchet" Physical Review B 63 054515 (2001).
M. Castellano, et al., "Thermally activated escape from the zero–voltage state in long Josephson junctions", Physical Review B, 54(21), 15417 (Dec. 1, 1996).

(List continued on next page.)

Primary Examiner—Sara Crane
(74) Attorney, Agent, or Firm—Jones Day; Brett Lovejoy

(57) ABSTRACT

A method for inserting fluxons into an annular Josephson junction is disclosed. Fluxon injection according to the present invention is based on local current injection into one of the superconducting electrodes of the junction. By choosing an appropriate value for the injection current, which depends upon the spacing between injecting leads among other factors, the residual fluxon pinning can be reduced to a very small level. Fluxon injection according to the present invention provides for fully controlling the trapping of individual fluxons in annular Josephson junctions and is reversible to a state of zero fluxons without heating the Josephson above its critical temperature. Fluxon injection according to the present invention can be used for preparing the working state of fluxon oscillators, clock references, radiation detectors and shaped junctions that may be used as qubits for quantum computing.

22 Claims, 12 Drawing Sheets

OTHER PUBLICATIONS

G. Costabile et al., "rf–induced steps in intermediate length Josephson–tunnel junctions", Journal Applied Physics 63, 5406 (1988).

L. Chiatti, et al., "Is Macroscopic Quantum Coherence Incompatible with Macroscopic Realism?", IL Nuovo Cimento B 110, N. 5–6, pp. 585–591 Jan. 19, 1995).

M. Cirillo et al., "Dynamical evidence of critical fields in Josephson junctions", PRB, 56, 11889 (Nov. 1, 1997).

A. Davidson et al., "Experiments on soliton motion in annular Josephson junctions", Journal Applied Physics 60, 1447 (Aug. 1, 1986).

A. Davidson et al., "Experimental investigation of trapped Sine–Gordon solitons", Physical Review Letters 55, 2059 (Nov. 4, 1985).

David P. DiVencenzo, "The Physical Implementation of Quantum Computation", in *Scalable Quatnum Computers: Paving the Way to Realization* (S. Braunstein et al. eds., Wiley–VCH Verlag, 2001) [Also published as LANL preprint quant–ph/0002077 (2000)].

T. Drose, and C. Morais–Smith, "Metastability in Josephson transmission lines", Physical Review B 61, 1506 (2000).

Marc Feldman, "Josephson Junctions Digital Circuits—Challenges s and Opportunities", [published in Japanese] in FED Review, FED Superconducting Project: Josephson Device Hybrid System (FED, Tokyo, 1998) pp. 23–46. [This manuscript was submitted in English (Jan. 2, 1998) for Translation to Japanese].

A. Filippov, et al., "Critical currents in Josephson junctions with microinhomogeneities attracting solitons", Physics Letters A 120, 47 (1987).

M. V. Fistul and G. F. Giuliani, "Critical current of a long Josephson junction in the presence of a perturbing Abrikosov vortex", Physical Review B 58, 9343 (1998).

M. Fistul, et al., "Escape of a Josephson vortex trapped in an annular Josephson junction", Physica B, 284–288, 585–586 (2000).

A. Franz, et al., "Magnetic field penetration in a long Josephson junction imbedded in a wide stripline", Journal Applied Physics 89, 471 (2000).

A. Franz, et al., "Measurements of the critical current diffraction patterns in annular Josephson junctions", Physical Review B 62(1), 119 (Jul. 1, 2000).

J. Friedman, et al., "Quantum super–position of distinct macroscopic states", Nature 406, 43 (Jul. 6, 2000).

A. Fujimaki et al., "Spatiotemporal observation of the soliton–antisoliton collision in a Josephson transmission line", Physical Review Letters 59, 2895 (Dec. 1, 1987).

F. Gaitan, "Berry phase modification of the current drive in a restricted class of large annular Josephson junctions at low temperature", Physical Review B 63, 104511–1 (2001).

E. Goldobin, A. Wallraff, N. Thyssen, and A. V. Ustinov, "Cherenkov radiation in coupled long Josephson junctions", Physical Review B 57, 130 (1998).

A. Goldobin, A. Sterk, and D. Koelle, "Josephson vortex in a ratchet potential: Theory", Physical Review E 63, 031111 (2001).

D. Gupta and Y. Zhang, "On–Chip Clock Technology for Ultrafast Digital Superconducting Electronics", Applied Physics Letters 76, pp. 3819–3821 (2000).

J. B. Hansen et al., "Low frequency noise in resonant Josephson soliton oscillators", IEEE Trans. Mag., 27, 3343 (Mar. 1, 1991).

Z. Hermon, et al., "Dephasing length and coherence of a quantum soliton in an ideal long Josephson junction", Physical Review Letters 74(24), 4915 (Jun. 12, 1995).

V. Kaplunenko, V. Borzenets, N. Dubash, and T. Van Duzer, Applied Physics Letters 71, pp128–130 (1997).

Y. Kasai, "Fluxon dynamics in isolated long Josephson junctions", Physica C 352, pp. 211–214 (2001).

T. Kato, and M. Imada, "Macroscopic quantum tunneling of a fluxon in a long–Josephson junction", Journal Physical Society Japan 65(9), 2963 (Sep. 1, 1996).

S. Keil, et al., "Magnetic flux pinning in annular Josephson junctions in a barrier parallel dc magnetic field", Physical Review B 54(21), 14948 (Dec. 1, 1996).

A. Kemp, et al., "Critical current diffraction patterns for annular Josephson junctions in dependence of the direction of the field", Conference on Future Perspectives of Superconducting Josephson Devices, Acquafredda di Maratea, Italy, (Jul. 1, 2000).

Y. Kivshar, and B. Malomed, "Interaction of a fluxon with a local inhomogeniety in a long Josephson junction", Physics Letters A 129, 443 (Jun. 1, 1988).

Yu. Koval, et al., "Narrow long Josephson junctions", IEEE Transactions on Applied Superconductivity, vol. 9 Issue: 2 Part: 3, 3957 (1999).

A. Laub et al., "Lorentz contraction of flux quanta observed in experiments with annular Josephson junctions", Physical Review Letters 75, 1372 (Aug. 1, 1995).

Y. Makhlin, G. Schön, and A. Shnirman, "Quantum–State Engineering with Josephson–Junction Devices", Reviews of Modern Physics, vol. 73, 357 (2001).

B. Malomed, "Dynamics of a fluxon in a long Josephson junction with a periodic lattice of inhomogeneities", Physical Review B 38, 9242 (Nov. 1, 1998).

B. Malomed, and A. Ustinov, "Analysis of testing the single–fluxon dynamics in a long Josephson junction by a disspative spot", Physical Review B 49, 13024 (May 1, 1994).

N. Martucciello, and R. Monaco, "Annular Josephson tunnel junctions as an external magnetic field: the statics", Physical Review B 53(6), 3471 (Feb. 1, 1996).

N. Martucciello, et al., "Annular Josephson tunnel junctions in external magnetic field: the dynamics", Physical Review B 55(22), 15157 (Jun. 1, 1997).

N. Martucciello, et al., "Fluxon dynamics in long annular Josephson tunnel junctions", Physical Review B 57(9), 5444 (Mar. 1, 1998).

J. Mooij, et al., "Josephson persistent–current qubits", Science 285, 1036 (Aug. 13, 1999).

D. Munter, et al., "Fluxon pinning through interaction with the superconducting wiring of long annular Josephson junctions", Physical Review B 58, 14518 (Dec. 1, 1998).

Y. Nakamura, et al., "Coherent control of macroscopic quantum states in a single–Cooper–pair box", Nature 398, 786 (Apr. 29, 1999).

C. Nappi, et al., "Fiske steps in annular Josephson junctions with trapped flux quanta", Physical Review B 58(17), 11685 (Nov. 1, 1998).

C. Nappi, "Critical–current diffraction pattern of annular Josephson junctions", Physical Review B 55(1), 82 (1997).

K. Neurohr et al., "Local suppression of J. currents in niobium / 2–D e– / gas/niobium structures by an injection current", Physical Review B 59, 11197 (May 1, 1999).

J. Nordman, "Superconductive amplifying devices using fluxon dynamics", Superconductor Science & Technology 8, 681 (1995).

O. Olsen & M. Samuelson, "Fluxon propagation in long Josephson junctions with external magnetic field", Journal Applied Physics 52, 6247 (1981).

T. P. Orlando & K. A. Delin, *Foundations of Applied Superconductivity*, Addison–Wesley Publishing Company Inc. (1991).

T. P. Orlando, et al., "A superconducting persistent current qubit", Physical Review B 60, 15398 (Dec. 1, 1999).

N. Pederson, "Fluxon electronic devices", IEEE Transactions Magnetics 27, 3328 (Mar. 1, 1991).

V. Plerou and F. Gaitan, "Dynamic interplay of Berry's phase and spectral flow in the current–voltage characteristics of a restricted class of large SNS annular Josephson junctions", Physical Review B 63, 104512–1 (2001).

H. Preβler, "Fluxon bunching in Josephson tunnel junctions", Physics Letters A 244, pp. 149–154 (Jul. 13, 1998).

S. Sakai, et al., "Fluxon observation using a Josephson sampler", Japanese Journal of Applied Physics 22, L479 (Aug. 1983).

A. Shnirman et al.,"Tunneling and resonant tunneling of fluxons in a long Josephson junction", Physical Review B 56, 14677 (Dec. 1, 1997).

A. V. Ustinov, Pis'ma Zh. Eksp. Teor. Fiz. 64, 178 (1996) [Soviet Physics JETP Letters 64, 191 (1996)].

A. V. Ustinov, T. Doderer, R. P. Huebener, N. F. Pedersen, B. Mayer, and V. A. Oboznov. "Dynamics of sine–Gorgon solitons in the annular Josephson junction", Physical Review Letters 69, 1815–1818 (1992).

A. V. Ustinov, T. Doderer, B. Mayer, R. P. Huebener, and V. A. Oboznov, "Trapping of several solitons in annular Josephson junction", Europhysics Letters 19, 63–68 (1992).

A. Ustinov, et al., "Soliton trapping in a harmonic potential: experiment", Physics Letters A 233, 239 (1997).

A. Ustinov, and N. Thyssen, "Experimental study of fluxon dynamics in a harmonic potential well", Journal of Low Temperature Physics 106, 193 (1997).

A. Ustinov, "Solitons in Josephson junctions", Physica D 123, 315 (1998).

I. Vernik, et al., "Observation of supersoliton resonances in the modulated annular Josephson junction", Physical Letters A 168, 319 (1992).

I. Vernik, et al., "Fluxon pinning in annular Josephson junctions by an external magnetic field", Journal of Applied Physics 81(3), 1335 (1997).

I. Vernik, et al.,"Soliton bunching in annular Josephson junctions", Journal Applied Physics 79, 7854 (May 1, 1996).

A. Vystavkin, et al., "First observation of static bound states of fluxons in long Josephson junctions with inhomogeneities", Soviet Journal Low Temperature Physics 14, 357 (Jun. 1, 1988).

A. Wallraff, "Fluxon Dynamics in annular Josephson junctions: From relativistic strings to quantum particles", PhD thesis, University of Erlangen–Nurnberg, Germany, (2000).

A. Wallraff, et al., "Annular long Josephson junctions in a magnetic field: Engineering and probing the fluxon potential", Journal Low Temperature Physics 118(5/6), 543 (2000).

Y. Zhang and D. Gupta, "Low–jitter on–chip clock for RSFQ circuit applications" Superconducting Science & Technology 12, 769–772 (1999).

* cited by examiner (a)

(b)

FLUXON INJECTION INTO ANNULAR JOSEPHSON JUNCTIONS

RELATED APPLICATIONS

This application derives from Provisional Patent Application Serial No. 60/283,477, filed Apr. 11, 2001 and incorporated herein by reference, and claims priority therefrom pursuant to one or more of 35 U.S.C. §119, §120, §365.

BACKGROUND

1. Field of the Invention

This invention relates generally to Josephson junctions and, more particularly, to injection of fluxons into annular Josephson junctions.

2. Discussion of Related Art

Long Josephson junctions are interesting systems from the perspective of providing a workbench for fundamental investigations of a variety of superconducting phenomena, as well as having various applications in cryoelectronics. For an elementary introduction see SUPERCONDUCTIVITY by Charles P. Poole, Jr., Horacio A. Farach and Richard J. Creswick (Academic Press, 1995), pp. 442–444 and references cited. Long Josephson junctions are also useful for studying basic properties of solitary waves (solitons). Solitons of the simplest type are topological kinks and are able to propagate. A well-known example of such a soliton is the elementary quantum of magnetic flux $\Phi_0$ (also called a fluxon, or Josephson vortex) in a long Josephson junction. See, for example, A. Barone and G. Paternò, PHYSICS AND APPLICATIONS OF THE JOSEPHSON EFFECT (Wiley, N.Y. 1982); A. V. Ustinov, Physica D 123, 315 (1998). A fluxon in a long Josephson junction can be caused to move along the junction by the application of a bias current $I_B$ flowing across the junction. The resulting motion of such a fluxon gives rise to a dc voltage $V_{dc}$ across the junction, which is proportional to the fluxon's mean velocity $\upsilon$. Thus, a measurement of $V_{dc}$ as a function of $I_B$ provides a useful way to gain information about properties of the fluxons, including the number of fluxons present.

Our primary concern herein is with long Josephson junctions which, for economy of language, we refer to simply as "junctions" understanding thereby that long Josephson junctions are understood. Explicit descriptions of junctions having other shapes will be included when necessary for clarity.

An important property of an annular long Josephson junction results from the quantization of magnetic flux in a superconducting ring. The annular junction is a topologically closed system such that the number of initially trapped fluxons is conserved and new fluxons can be created only in the form of fluxon-antifluxon pairs. See, e.g., A. Davidson, B. Dueholm, B. Kryger, and N. F. Pedersen, Phys. Rev. Lett. 55 2059 (1985). Fluxon motion in annular junctions occurs under periodic boundary conditions and without any reflections from boundaries, thereby avoiding many mathematical and physical complications that occur for fluxon motion in other junction shapes. One source of the interest in investigating annular junctions derives from fundamental aspects of the Berry phase effect that arises in annular junctions. (see e.g. F. Gaitan, Phys. Rev. B 63, 104511-1 (2001); and V. Plerou and F. Gaitan, Phys. Rev. B 63, 104512-1 (2001)). Other sources of interest in annular junctions arise from the phenomena of Cherenkov radiation by solitons that can be studied therein. (see, for example, E. Goldobin, A. Wallraff, N. Thyssen, and A. V. Ustinov, Phys. Rev. B 57, 130 (1998); and A. Wallraff, A. V. Ustinov, V. V. Kuring, J. A. Shereshevsky, and N. K. Vdovicheva, Phys. Rev. Lett. 84, 151 (2000)). Applications with a view towards the development of practical devices can also be investigated with annular junctions.

Ring-shaped annular junctions have also been proposed as microwave sources with high stability and very narrow radiation line width (for example, see U.S. Pat. No. 4,181,902 to A. C. Scott). Annular junctions with trapped fluxons have also been suggested as radiation detectors in which they have an advantage of a stable operation point at a finite voltage. (See for example, C. Nappi and R. Christiano, Appl. Phys. Lett. 70, 1320 (1997); M. P. Lisitskii et al., Nucl. Instr. and Methods in Phys. Research A 444, 476 (2000)). More recently, annular junctions of special shapes have been proposed for the creation, storage and manipulation of quantum bits ("qubits") in the form of fluxons (see A. Wallraff, Y. Koval, M. Levitchev, M. V. Fistul, and A. V. Ustinov, J. Low Temp. Phys. 118, 543 (2000)); and fluxon ratchets (E. Goldobin, A. Sterk, and D. Koelle, Phys. Rev. E 63, 031111 (2001), and Carapella, Phys Rev. B 63, 054515 (2001)). Fluxons in Josephson transmission lines, which are discrete analogs of long Josephson junctions, have been proposed as on-chip clocks by V. Kaplunenko, V. Borzenets, N. Dubash, and T. Van Duzer, Appl. Phys. Lett. 71, pp 128–130 (1997), Y. Zhang and D. Gupta, Supercond. Sci. Technol., 12, pp 769–772 (1999), D. Gupta and Y. Zhang, App. Phys. Let. 76, pp. 3819–3821 (2000), and U.S. Pat. No. 6,331,805, "On-Chip long Josephson Junction (LJJ) Clock Technology", to Gupta et al.

A significant problem in utilizing fluxon states in annular junctions is preparation of the initial state of the system containing a single or a predetermined number of fluxons. For example, in order to realize a state having a single fluxon, a single magnetic flux quantum has to be trapped in the junction, i.e., between its superconducting electrodes. The only reliable and reproducible technique for trapping fluxons in an annular junction that has been previously known and used requires rather exotic and complicated apparatus, namely a low temperature scanning electron (or laser) microscope. See e.g. A. V. Ustinov, T. Doderer, B. Mayer, R. P. Huebener and V. A. Oboznov, Europhys Lett. 19, 63 (1992). Other known methods for trapping magnetic flux in an annular junction can be used while cooling the sample below the critical temperature of its superconducting electrode(s). These other methods are based on either sending a current through an additional specially designed coil placed on top of the annular junction (see I. V. Vernik, V. A. Oboznov and A. V. Ustinov, Phys. Lett.A 168, 319 (1992)), or applying a small bias current directly through the junction (see A. V. Ustinov, Pis'ma Zh. Eksp. Teor. Fiz. 64, 178 (1996) [Sov. Phys. JETP Lett. 64, 191 (1996)]; and I. V. Vernik, S. Keil, N. Thyssen, T. Doderer, A. V. Ustinov, H. Kohlstedt, and R. P. Huebener, J. Appl. Phys. 81, 1335 (1997)). Unfortunately, the latter techniques are not sufficiently reproducible and require heating of a junction to high temperature. Moreover, fluxons trapped in such ways often suffer from parasitic pinning due to Abrikosov vortices which become trapped in superconductive electrodes. Thus, there is a need for a system to inject a single fluxon, or a known number of fluxons, in a controlled manner into an annular Josephson junction. The present invention is directed to providing such a system.

SUMMARY

The present invention relates to a fluxon injection system including injection electrodes separated by a distance D in contact with one terminal of an annular Josephson junction.

Fluxons are trapped on the annular Josephson junction when an injection current of sufficient magnitude is injected through the injection electrodes.

Application of an injection current causes current to flow from one of the injection electrodes into a superconducting electrode and across the Josephson barrier. The current is collected by another injection electrode on the same superconducting electrode so that the total current across the Josephson barrier remains zero. A magnetic flux is thus created in the region between the injection electrodes. As the magnitude of the magnetic flux created by the injection current increases and becomes larger than the elementary quantum of magnetic flux, $\Phi_0$, it may become energetically favorable for a compensating negative flux to be created. If the induced flux exceeds $\Phi_0$, the remaining positive flux on the annular Josephson junction can exist in solitary form and become a fluxon. The induced flux on the annular Josephson junction is removed when the injection current is removed. In this case, the compensating negative flux annihilates the remaining solitary positive flux and the junction is then free of fluxons. Thus, control of the properties of the system, including the current flow between the injection electrodes and the electrode spacing, results in controlled insertion of fluxons into the annular junction. Such controlled fluxon initial states on annular Josephson junctions can be used in connection with clock references, radiation detectors, and fluxon oscillators, among other applications. Shaped junctions can advantageously be employed along with the injection systems of the present invention for initialization of qubits for quantum computing, among other applications.

These and other embodiments are further described below with respect to the following figures.

BRIEF DESCRIPTION OF THE FIGURES

FIG. 1($b$) illustrates fluxon insertion according to some embodiments of the present invention (dimensions are not to scale).

FIG. 9$b$ shows a flux injection system according to the present invention utilizing a compact, symmetric and uniformly biased annular junction as for a soliton oscillator or clock, among other purposes.

DETAILED DESCRIPTION OF THE INVENTION

The present invention relates to fluxon injection systems. Further, the fluxon injection systems according to some embodiments of the present invention are demonstrated both experimentally and numerically. Experimental demonstrations of the fluxon injection systems according to some embodiments of the present invention show injection and removal of a desired number of fluxons into or out of an annular Josephson junction. Further, a theoretical model of the fluxon injection systems is described. Numerical simulations based on the proposed model describing the fluxon injection systems show good agreement with the experimental data and provide further insight into the fluxon injection process and fluxon interaction with small pinning potential remaining in the injection region. Several embodiments of the fluxon injection systems according to the present invention are described.

Figure 1A:
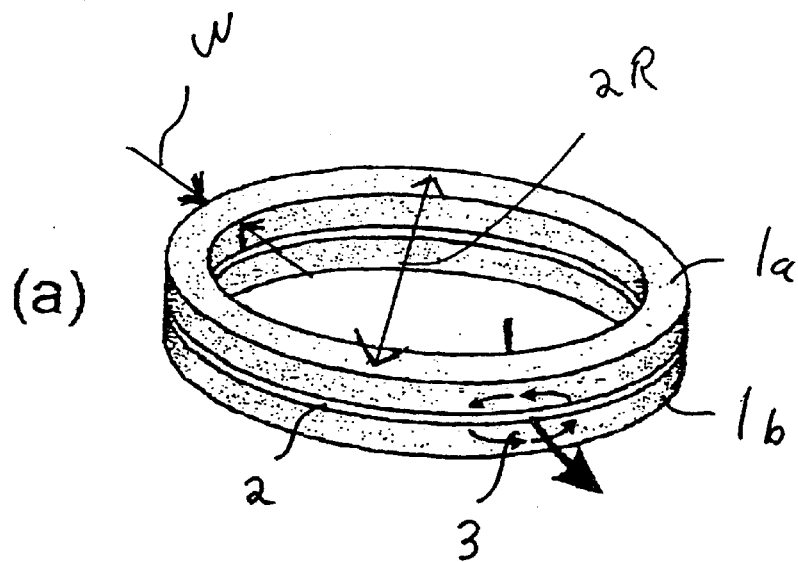
FIG. 1($a$) shows a plan view of an annular Josephson junction with a trapped fluxon (dimensions are not to scale).

An annular Josephson junction with a trapped fluxon is shown schematically in FIG. 1($a$) comprising superconducting electrodes 1$a$ and 1$b$, Josephson tunneling barrier, 2 and fluxon, 3. The depiction of FIG. 1($a$) corresponds to the special case in which the fluxon, 3, is trapped between the electrodes 1$a$ and 1$b$ when the junction is in the process of cooling down through the critical temperature T, of the superconducting electrodes. Usually, however, when cooling a Josephson junction through the superconducting critical temperature of the electrodes, no such fluxon becomes trapped in the junction. Fluxon injection must be accomplished during cooling through $T_c$ since it is usually not possible to inject a fluxon into the junction when the junction is in its superconducting state, that is, below $T_c$.

Figure 1B:
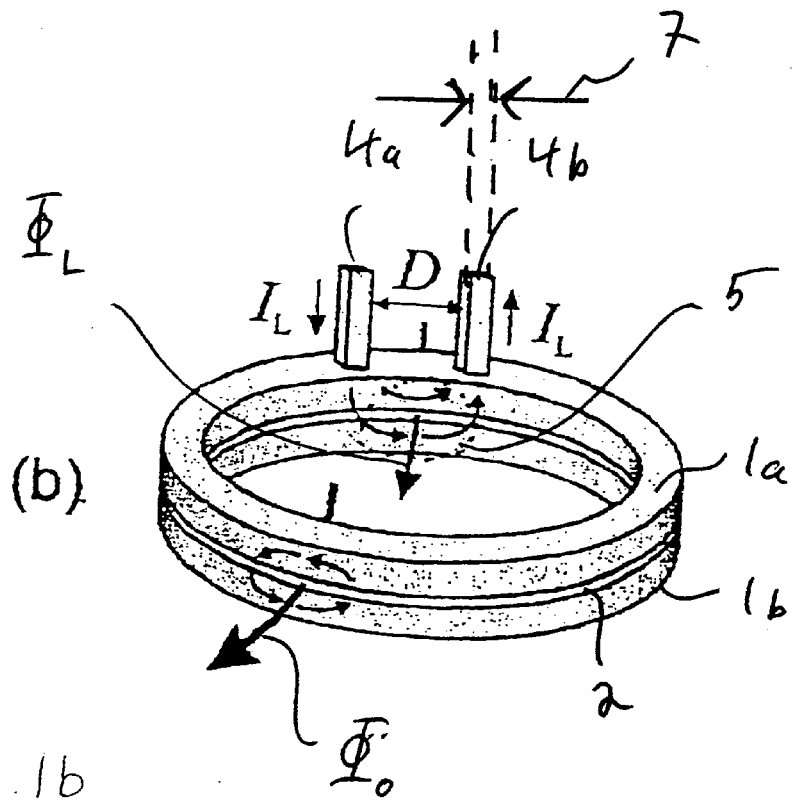

The present invention relates to a fluxon injection system including local injection of current $I_L$ into the superconducting electrodes of the junction by means of injection leads attached thereto, schematically shown as 4$a$ and 4$b$ in FIG. 1($b$). Unlike the special case depicted in FIG. 1($a$), it is assumed for the schematic depiction of FIG. 1($b$) that there is no magnetic flux trapped in the junction in the absence of injection current, that is when $I_L$=0. When the current $I_L$ is turned on, current flows from the injection lead 4$a$ into the superconducting electrode 1$a$ as 5 and also flows across the Josephson barrier, 2. This current $I_L$ is collected by lead 4$b$, such that the total current across the Josephson barrier 2 remains equal to zero. The current $I_L$ generates a local magnetic flux $\Phi_L$ which, without loss of generality, can be taken to satisfy $\Phi_L$>0 in the region between the injection leads 4$a$ and 4$b$. As the injection current $I_L$ increased, $\Phi_L$ also increases. As $\Phi_L$ becomes larger than $\Phi_0$, it may become energetically favorable to have $\Phi_L$ compensated by a negative magnetic flux $-\Phi_0$ (with a magnetic field component directed outside the ring, see FIG. 1(b)). Note that the energy contained in a magnetic field increases as the square of magnetic field. Thus, two separated flux quanta $\Phi_0+\Phi_0$ will have lower energy ($\sim 2\Phi_0^2$) than a single $2\Phi_0$ fluxon ($\sim 4\Phi_0^2$). Since the total magnetic flux in the junction barrier has to remain zero because of the quantization of magnetic flux, there also has to appear a positive magnetic fluxon $\Phi_0$ somewhere else in the junction. As soon as the current $I_L$ gets large enough such that $\Phi_L > \Phi_0$, the induced magnetic flux $+\Phi_0$ may exist in the long junction in the solitary form, i.e. as a free fluxon. Moreover, if $\Phi_0 > 2\Phi_0$, two free fluxons should appear, and so on.

One anticipates that the existing N free fluxons will interact with the remaining magnetic flux ($\Phi_L - N\Phi_0$) near the injection leads. An important feature of a fluxon injection system according to some embodiments of the present invention is that the interaction of free fluxons with the remaining magnetic field (which leads to pinning of free fluxons) can be minimized by appropriate choices for the distance D between the injection leads and for the injection current value $I_L$.

Figure 2:
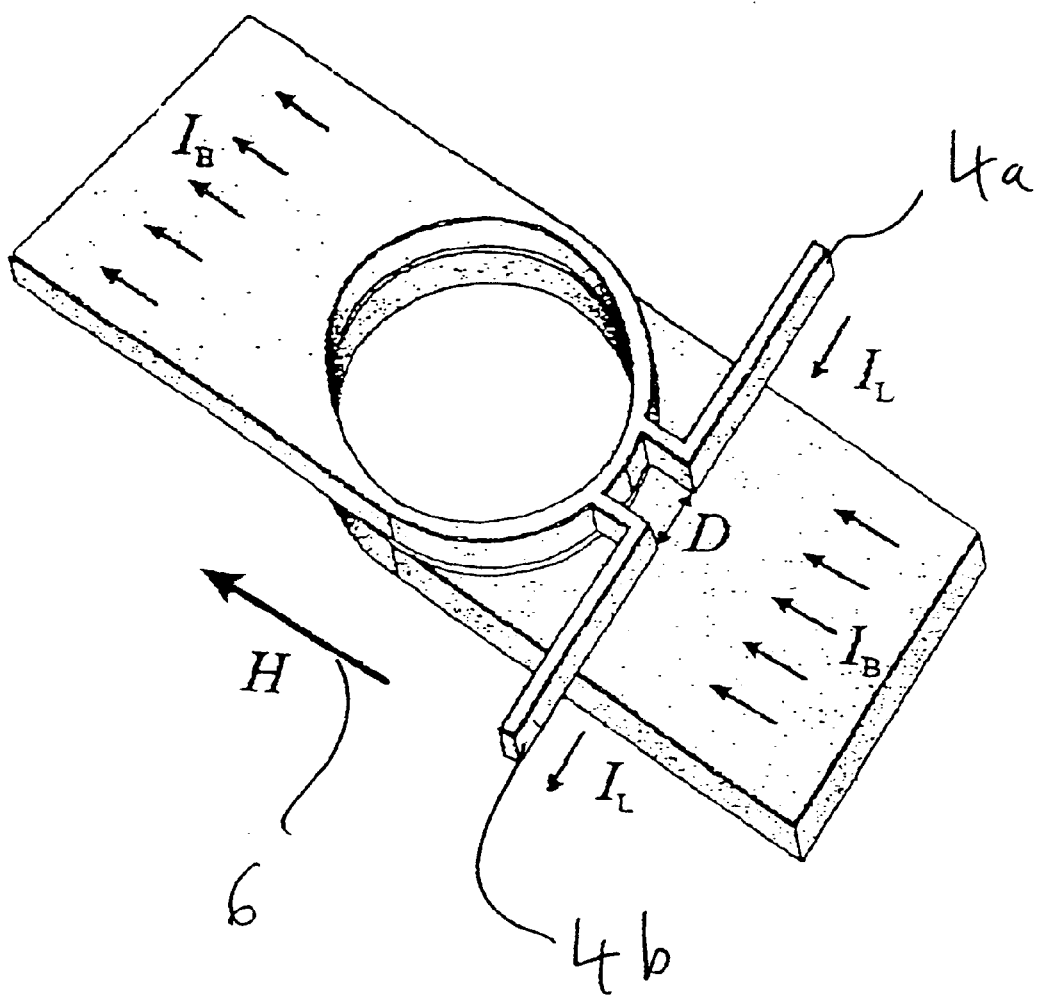
FIG. 2 shows a schematic view (dimensions are not to scale) of an experimentally studied annular Josephson junction having local current injection leads according to some embodiments of the present invention.

Experiments have been performed with Nb/Al—AlO$_x$/Nb Josephson annular junction with the mean diameter 2R=100 $\mu$m and the width W=4 $\mu$m. ($\mu$m=10$^{-6}$ meter), both as depicted in FIG. 1. The so-called Lyngby geometry furnished with additional local current injection leads 4a and 4b as shown in FIG. 2 has been used in these experiments. The Lyngby geometry is often chosen for experiments as it provides rather uniform bias current distribution over the junction ($I_B$ in FIG. 2) and, at the same time, it has proven to be suitable for fluxon trapping at $T_c$.

Fluxon insertion using local current injection pursuant to the present invention is not limited to the Lyngby geometry of FIG. 2, but can be done for essentially any annular junction geometry, as discussed further below.

The junction used for the experimental examples presented herein has a critical current density of about 1.1 kA/cm$^2$ which corresponds to a Josephson length $\lambda_J \approx 11$ $\mu$m and a plasma frequency $\omega_p/(2\pi) \approx 135$ GHz. This implies the ratio $2\pi R/\lambda_J = l \approx 28$ of the junction's length to the fluxon's size and the junction width $W/\pi_J < 1$, i.e., the junction can be regarded as long and quasi-one-dimensional. The local current $I_L$ was applied via 2 $\mu$m-wide leads spaced by a distance D=22 $\mu$m. A magnetic field H was applied in the plane of the tunnel barrier (shown as 6 in FIG. 2) using a coil with a conversion ratio about 0.35 Oe/mA. The measurements were done at the temperature of 4.2 K.

Figure 3A:
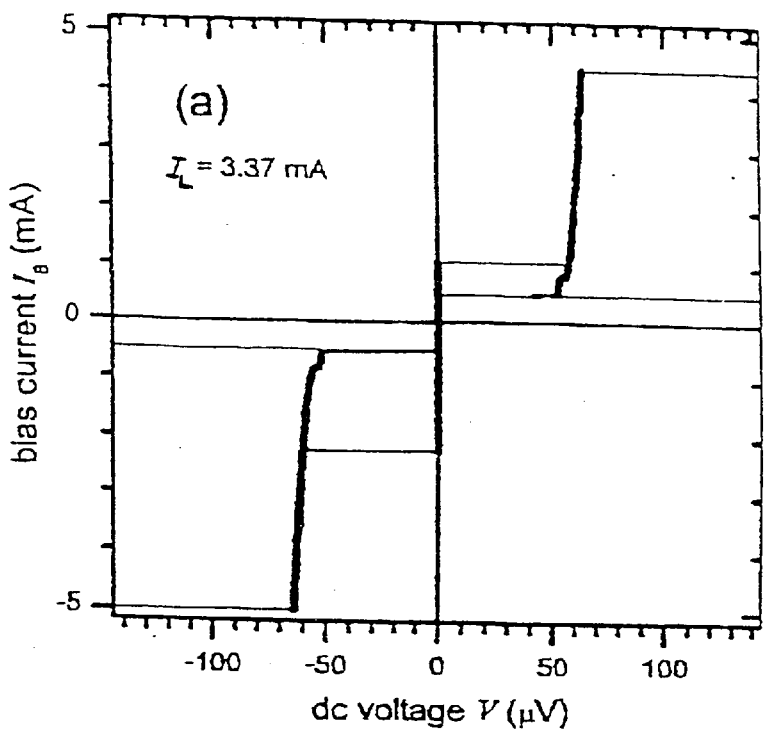
FIGS. 3($a$) and 3($b$) show experimentally measured current-voltage characteristics of annular junction at injection currents $I_L$=3.37 mA and $I_L$=6.68 mA, respectively.
Figure 3B:
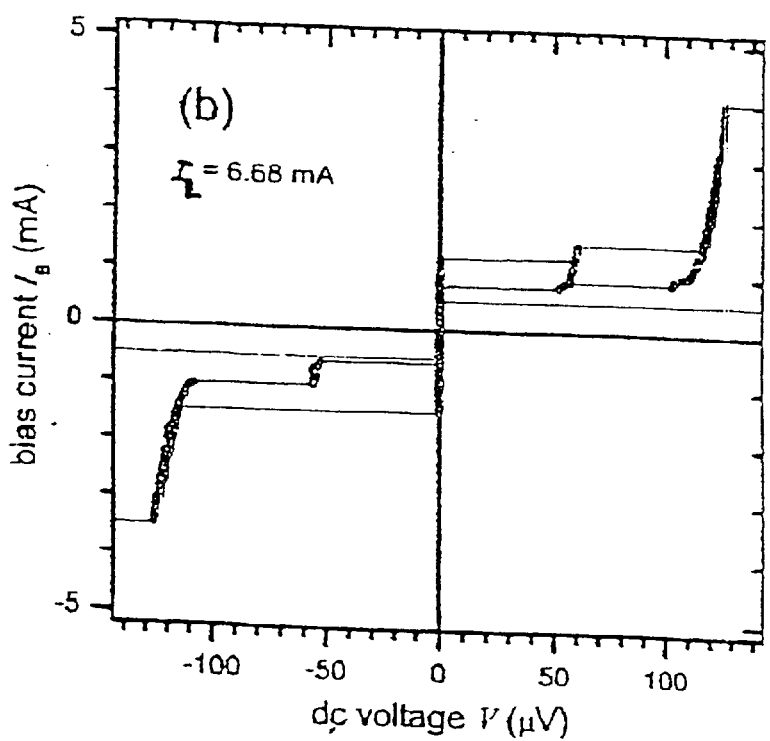

Measurements were performed in the junction state with no fluxons trapped in the junction barrier during cooling down. The critical current $I_c$ at $I_L=0$ and H=0 was about 7.8 mA. Increasing $I_L$, causes the critical current to decrease and fluxon steps appear in the current-voltage ($I_B-V_{dc}$) characteristics (i.e. bias current vs dc voltage). FIGS. 3a and 3b show two examples of $I_B-V_{dc}$ curves obtained at two different values of the injection current $I_L$, which was kept on and constant during the course of every measurement. At $I_L=3.37$ mA (FIG. 3(a)), there is a clear single fluxon step with an asymptotic voltage of about 64 $\mu$V. This $I_B-V_{dc}$ curve indicates the fluxon depinning current $L_{db}$ to be rather small, about 13% of the junction's critical current $I_c$ measured at $I_L=0$. From the top of the step, the junction switches to superconducting gap voltage.

FIG. 3(b) shows the $I_B-V_{dc}$ curve obtained at injection current $I_L=6.68$ mA. Here we find the double-fluxon step with an asymptotic voltage of about 128 $\mu$V. Again, from the top of this step the junction switches to the gap voltage. We note also the remaining depinning current and the single-fluxon step have substantially reduced current amplitude.

Figure 4:
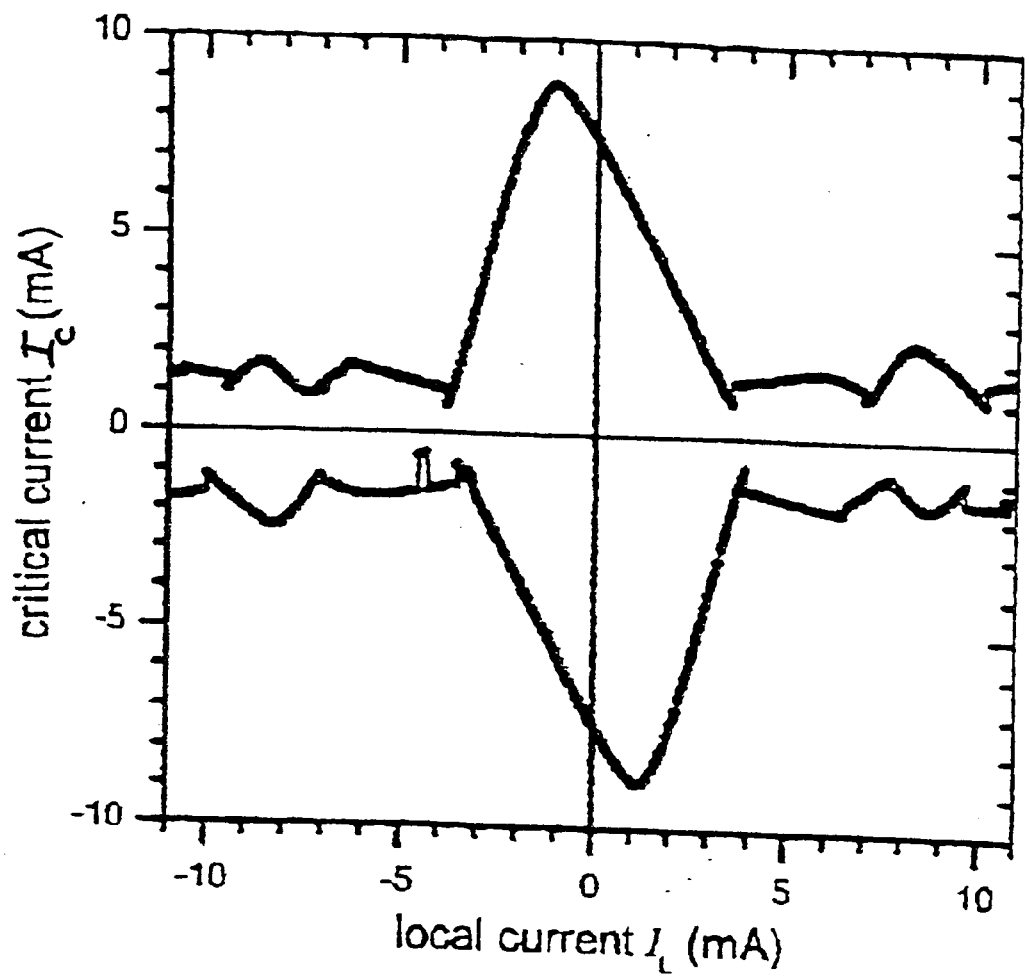
FIG. 4 shows the measured dependence of critical current of the annular junction $I_c$ on injection current $I_L$ for some embodiments of the present invention.

The effect of the local current injection $I_L$ on the critical current of the studied annular junction is presented in FIG. 4. Since this dependence was found to be not completely symmetric, all four quadrants of the ($I_c$, $I_L$) plane are presented. The similarity of the observed dependence of $I_c$ on $I_L$ of FIG. 4 to the conventional Fraunhofer-like pattern of the critical current of a small Josephson junction on magnetic field is striking. It can be noted that the single and double fluxon $I_B-V_{dc}$ curves observed in FIG. 3 correspond approximately to the first and second minima of the Fraunhofer pattern, respectively.

Figure 5:
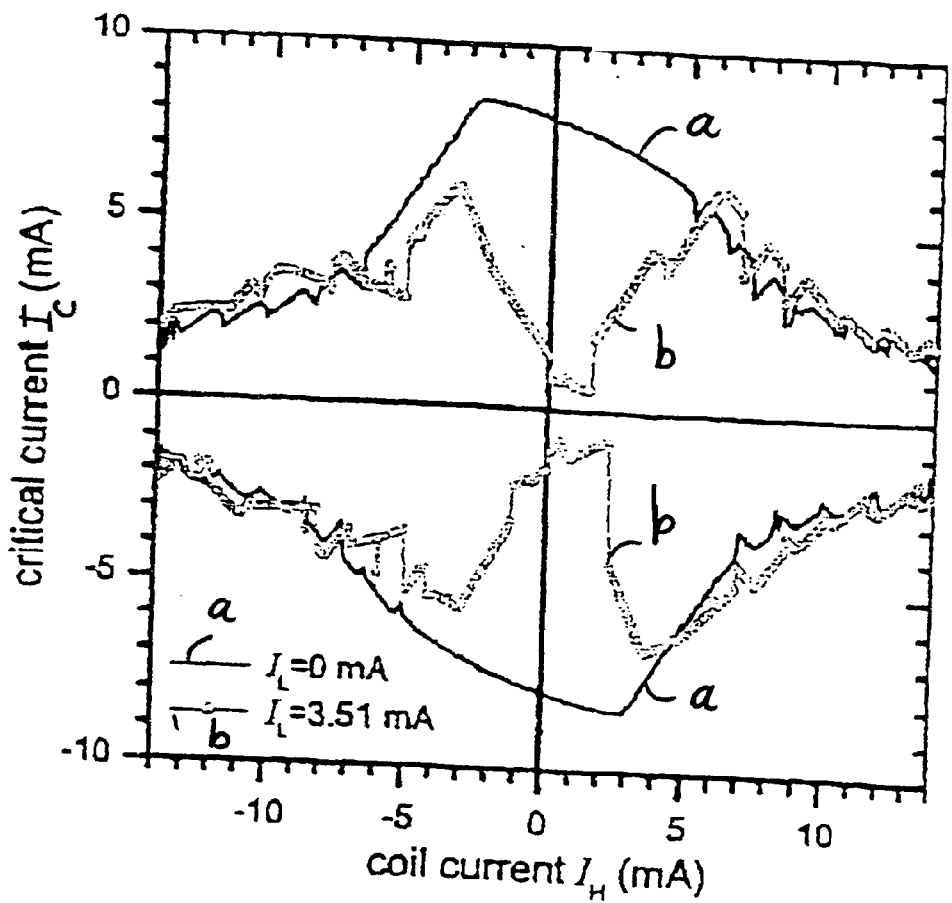
FIG. 5 shows the measured dependence of the critical current of the annular junction $I_c$ on the applied magnetic field H generated by a current $I_H$ delivered to a coil for $I_H$=0 mA (solid line, a) and for $I_H$=3.51 mA (line with dots, b).

FIG. 5 presents experimental data on the critical current dependence on the applied magnetic field, H generated by a current $I_H$ delivered to a coil, both with an injection current ($I_L$=3.51 mA) and with no injection current ($I_L$=0). One notes that the zero-injection pattern shown in FIG. 5 (curve (a)) is slightly asymmetric but, in general, looks rather as expected for a long annular junction with no trapped fluxons. In contrast, the $I_L$=3.51 mA curve (b) has a pronounced minimum around zero field. Such behavior looks very similar to that of an annular junction with one trapped fluxon, as studied in detail by I. V. Vernik, S. Keil, N. Thyssen, T. Doderer, A. V. Ustinov, H. Kohlstedt, and R. P. Huebener, J. Appl. Phys. 81, 1335 (1997), and A. V. Ustinov, B. A. Malomed, and N. Thyssen, Phys. Lett. A 233, 239 (1997). Indeed, this is consistent with the single-fluxon $I_B-V_{dc}$ curve observed in FIG. 3(a) which corresponds to a similar range of the injection current $I_L$. For some ranges at low values of the field H (between coil current values between approximately 2 mA and approximately 3 mA for both polarities), linear increase of $I_c$ with H is observed.

A long quasi-one-dimensional Josephson junction is described by the perturbed sine-Gordon equation for the superconducting phase difference $\phi$ across the junction (see A. Barone and G. Paternò, PHYSICS AND APPLICATIONS OF THE JOSEPHSON EFFECT (Wiley, N.Y. 1982)).

$$\phi_{xx}-\phi_{tt}=\sin\phi-\alpha\phi_t+\gamma+f(x) \qquad \text{Eq. (1)}$$

As used in Eq. 1, x is the spatial coordinate along the junction and t is time, measured, respectively, in units of the Josephson length $\lambda_J$ and inverse plasma frequency $\omega_p^{-1}$, and where subscripts refer to partial derivatives with respect to the indicated variable. The coefficient $\alpha$x accounts for the damping due to quasi-particle tunneling across the junction, while $\gamma$ and f(x) are the spatially-uniform and spatially-varying bias current densities, both normalized to the junction's critical current density $j_c$.

In the case of an annular junction with no fluxon trapped, solutions of Eq. (1) are subject to periodic boundary conditions, $\phi_x(x+l)=\phi_x(x)$ and $\phi(x+l)=\phi(x)$, where $l=2\pi R/\lambda_J$, is the normalized circumference of the junction.

In order to model the local current injection described above, the spatially-varying bias current term can be taken in the form $$f(x)=\epsilon[\delta(x_0)-\delta(x_0+d)], \qquad \text{Eq. (2)}$$

where $d=D/\lambda_J$ is the normalized spacing between the injection leads, $\epsilon$ is the injected current amplitude and $\delta$(x) is the Dirac delta function. The net current $\int f(x)dx$ over the junction is zero.

A related model has been studied almost two decades ago by Aslamazov and Gurovich (see L. G. Aslamazov and E. V.

Gurovich, Pis'ma Zh. Eksp. Teor. Fiz. 40, 22 (1984) [Sov. Phys. JETP Lett. 40, 746 (1984)]. They considered interaction of fluxons with an Abrikosov vortex that is trapped in one of the junction electrodes, with its normal core parallel to the tunnel barrier. The Abrikosov vortex was modeled by $$f(x) = \epsilon \delta_x(x_0), \qquad \text{Eq. (3)}$$

where $\delta_x(x_0)$ is the spatial derivative of the $\delta$ function at $x=x_0$. Later, the influence of the Abrikosov vortex was considered, in that the approach used in the references L. G. Aslamazov and E. V. Gurovich, Pis'ma Zh. Eksp. Teor. Fiz. 40, 22 (1984) [Sov. Phys. JETP Lett. 40, 746 (1984)] and M. V. Fistul and G. F. Giuliani, Phys. Rev. B 58, 9343 (1998) assumes the condition $\epsilon \ll 1$. In the case described by Eq. (2), the coefficient $\epsilon$ may be, in general, arbitrarily large.

Recently, the same problem of an Abrikosov vortex trapped near a long Josephson junction was studied in the theoretical paper M. V. Fistul and G. F. Giuliani, Phys. Rev. B 58, 9343 (1998). The Abrikosov vortex configuration considered by these authors is substantially the same as that of Aslamazov and Gurovich discussed above (L. G. Aslamazov and E. V. Gurovich, Pis'ma Zh. Eksp. Teor. Fiz. 40, 22 (1984) [Sov. Phys. JETP Lett. 40, 746 (1984)). The main result obtained in M. V. Fistul and G. F. Giuliani, Phys. Rev. B 58, 9343 (1998) is qualitatively similar to the findings obtained here in that the locally induced magnetic flux generates a stable state of two fluxons with opposite polarity, with one of them (antifluxon) pinned by the Abrikosov vortex and another (fluxon) moving freely in the rest of the junction. For an Abrikosov vortex the magnitude of the induced flux cannot exceed $\Phi_0$. Therefore the free energy of the above fluxon-antifluxon state is higher than that of the conventional (fluxon-free) state. In the examples presented herein, local flux is induced by the external current $I_L$ and, thus, may exceed $\Phi_0$. The lowest-energy state then becomes the dissociated fluxon-antifluxon state.

In order to model the process and correctly interpret the obtained experimental results on fluxon injection, numerical simulations were performed by solving the partial-differential equation of Eq. (1). In the simulations, each $\delta$-function in Eq. (2) was approximated by the more smooth function $$\epsilon \delta(x - x_0) \approx \eta \left[ 1 - \tanh^2 \frac{2(x - x_0)}{\xi} \right], \qquad \text{Eq. (4)}$$

such that $\eta \xi = \epsilon$. The numerically injected bias is spread over a distance of about $\xi \lambda_J$. Through this paper, results obtained with $\xi = 0.5$ are presented, which approximate the actual experimental case. It has been checked, however, that taking $\xi = 1$ produces rather similar results, indicating that the results are not sensitively dependent on the precise value of $\xi$. In the numerically calculated current-voltage relationships, characteristics are shown in normalized limits as $\gamma(\upsilon)$, were $\upsilon$ is the normalized average fluxon velocity. With this normalization $\upsilon=1$ corresponds to the asymptotic voltage of the single-fluxon step. In order to save the computation time, the simulations are performed with the reduced normalized junction length l=10 and the dissipation coefficient $\alpha=0.1$.

Numerical results, in general, turn out to be very similar to the above presented experimental data. Two different values for the spacing d between the current injecting points, d=2 and d=1, have been chosen for simulation.

Figure 6A:
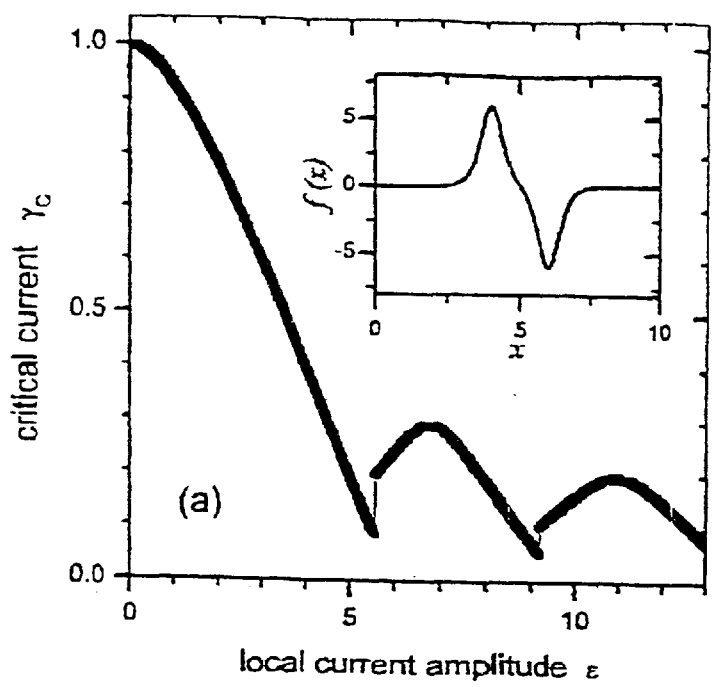
FIGS. 6$a$ and 6$b$ show numerically calculated dependencies of the normalized critical current of the annular junction $\gamma_c$ on the injection current amplitude $\epsilon$ for normalized spacing between injection electrodes, d=2 and d=1, respectively, along with insets showing the injection current profile.
Figure 6B:
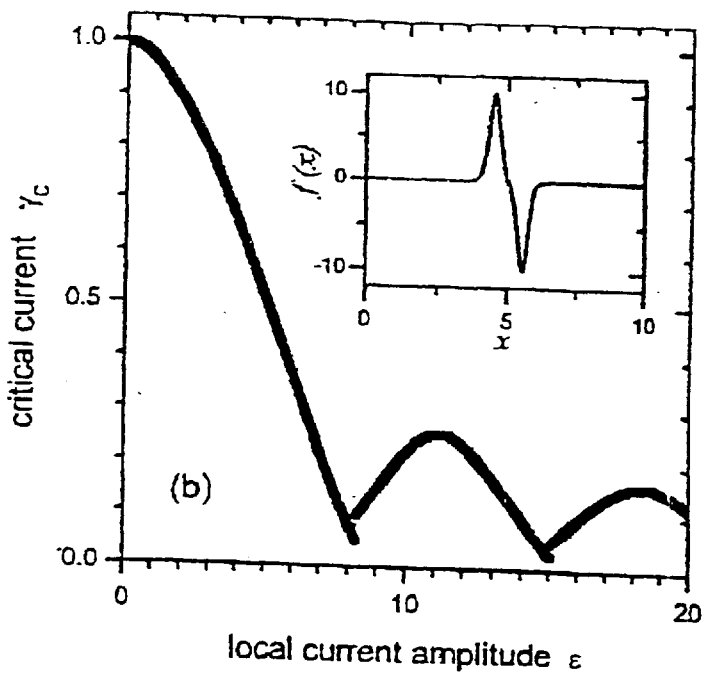

FIG. 6 presents the calculated dependence of the critical current $\gamma_c$ on the injection current amplitude $\epsilon$. As has been already seen in experiment, this dependence resembles the conventional Fraunhofer pattern of the critical current of a small Josephson junction in a magnetic field. The actual length of the corresponding small junction is associated with the distance d between the injecting points. As may be expected, the overlap between the lobes is larger for larger d, see, e.g. FIGS. 6(*a*) and (*b*). Due to this overlap, the minimum value of the critical (fluxon depinning) current between the lobes is decreasing with d.

Figure 7A:
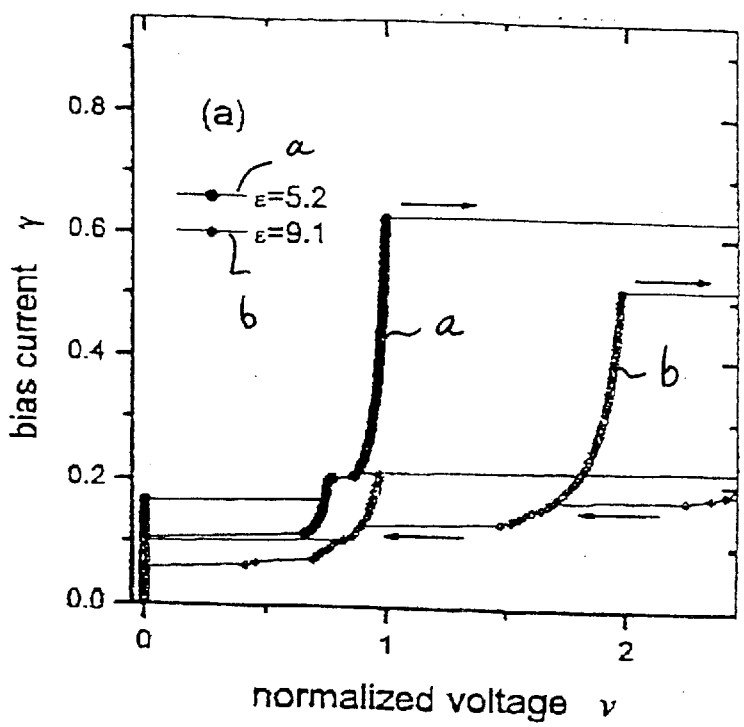
FIGS. 7$a$ and 7$b$ show numerically calculated current voltage characteristics of annular junction normalized injection electrode spacing d=2 and d=1, respectively, between the injectors and various injection currents.
Figure 7B:
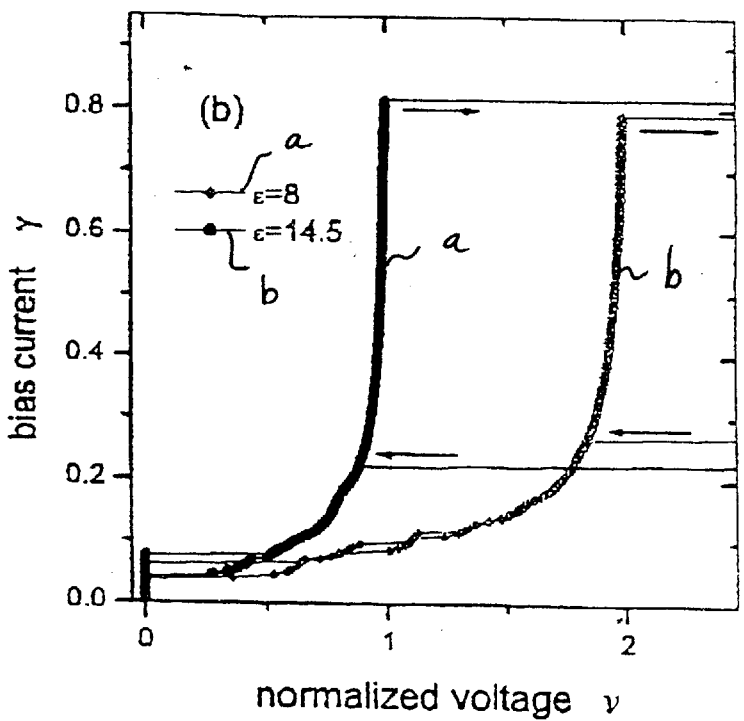

The calculated curves for normalized bias current $\gamma$ vs normalized voltage $\upsilon$ for various injection currents (indicated on the plots) are shown in FIG. 7. Both single fluxon and double fluxon steps can be clearly recognized. Altogether, these curves look very similar to those of FIG. 3, numerical data show that the steps on curves of FIG. 7 account for free moving fluxons under the action of the uniformly distributed bias current.

It can be seen in FIG. 7 that there is a residual pinning of fluxon(s) due to the effect of the local bias injectors. According to FIG. 6, this pinning is the smallest at the local injection current values which lie between the lobes of the $\gamma_c(\epsilon)$ curve. Thus, for a given injector spacing d the residual fluxon pinning can be minimized by choosing an appropriate value for the injection current $\epsilon$. The smallest pinning can be achieved when the lobes of the $\gamma_c(\epsilon)$ curve join at $\gamma_c=0$, that is for the cases in which d<1. Thus, the optimum spacing D between the injectors is about $\gamma_J$ or less (but advantageously larger than the width of the injection leads, 7, in order to avoid edge effects).

Figure 8:
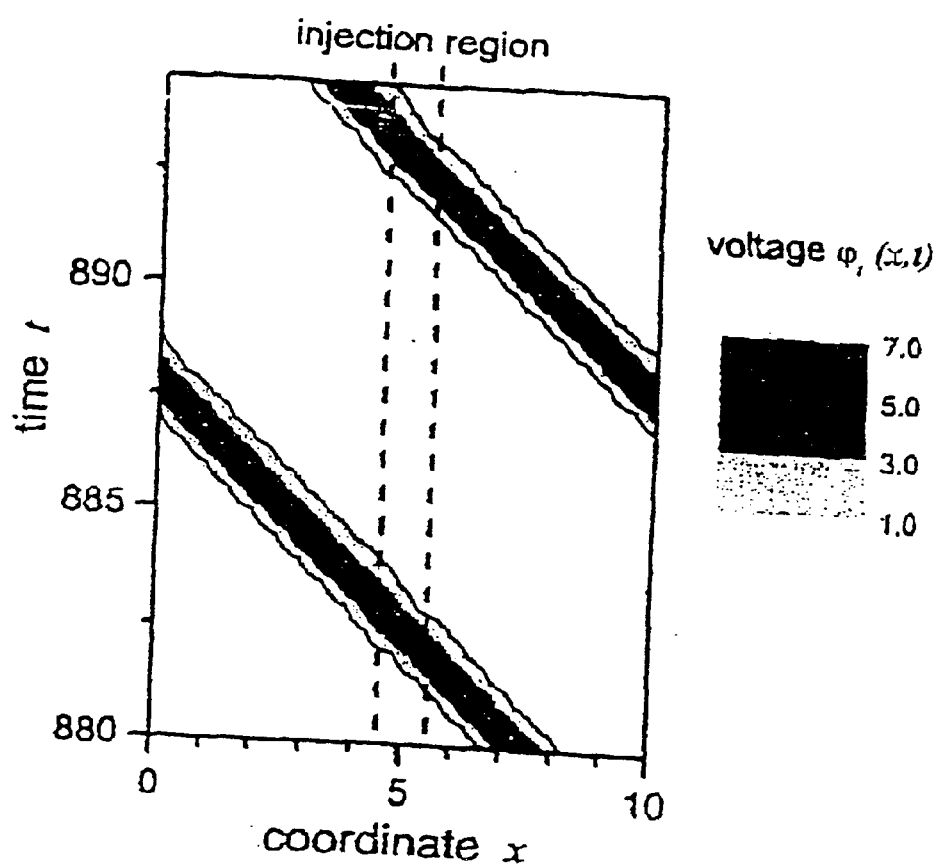
FIG. 8 shows the spatial-temporal evolution of the instantaneous normalized voltage in the simulated annular system for $\epsilon$=8, d=1, and $\gamma$=0.4.

This section of numerical results is concluded by FIG. 8. It shows a two dimensional gray scale plot of the spatial and temporal evolution of the instantaneous normalized voltage $\phi_t(x, t)$ in the annular junction for $\epsilon=8$, d=1 and $\gamma=0.4$. The moving fluxon is recognized as a solitary wave packet moving with a nearly steady velocity across the junction. One can see that there is just a very tiny disturbance of the fluxon motion arising in the region of local current injection. Obviously, this remaining pinning may be important only at low fluxon velocities, where the fluxon's kinetic energy is of comparable scale with the pinning potential.

Additional experimental results have been obtained for a reduced spacing between injectors of D=10 $\mu$m for comparison with the numerical results presented above. Other experimental conditions for the annular Jospehson junction related to the composition, geometry, temperature, among others are the same as given above in connection with the previous experimental results. D=10$\mu$ is approximately the same as the numerical results presented in FIGS. 6*b*, 7*b* and 8. (The experimental results presented herein have d=D/$\lambda_J \approx 1.1$).

Figures 10A, 10B:
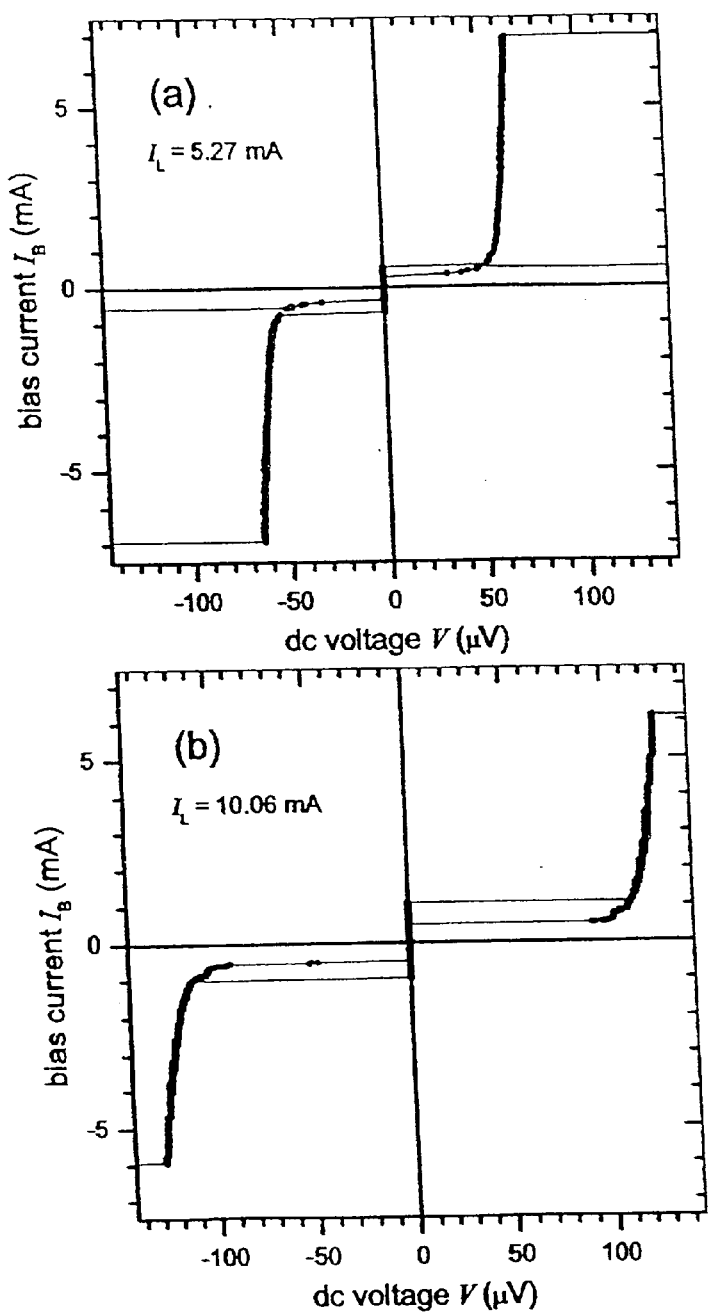
FIGS. 10($a$) and 10($b$) depict experimental current-voltage plots for two different values of $I_L$. 10($a$): $I_L$=5.27 mA. 10($b$): $I_L$=10.06 mA.

Measurements were commenced in the state having no trapped fluxons in the junction barrier during cooling. The critical current, $I_c$, at $I_L=0$ and H=0 is about 10.7 mA. FIGS. 10(*a*) and 10(*b*) give current-voltage plots for two different values of $I_L$. As above, the injection current is kept on and at a constant value during the measurements presented in FIG. 10. FIG. 10(*a*) clearly shows a single fluxon step with an asymptotic voltage value about 64 $\mu$V. FIG. 10(*a*) indicates that the fluxon depinning current is small, about 6% of the junction's critical current measured for $I_L=0$($I_{dp} \approx 0.64$ mA). This value is approximately a factor of 2 smaller than that measured above in which D was approximately a factor of 2 larger.

FIG. 10(*b*) depicts the current-voltage plot for an injection current $I_L=10.06$ mA, or roughly twice the injection current of FIG. 10(*a*). The double-fluxon step is apparent with an asymptotic voltage of about 128 $\mu$V.

We observe in FIG. 10 that the current amplitude of the fluxon steps is increased by almost 50% in comparison with the previous measurements for D=22 µm. At the same time, the remaining fluxon depinning current is reduced. These observations taken together indicate higher quality and uniformity of the fluxon states achieved in the annular Josephson junction.

Figure 11:
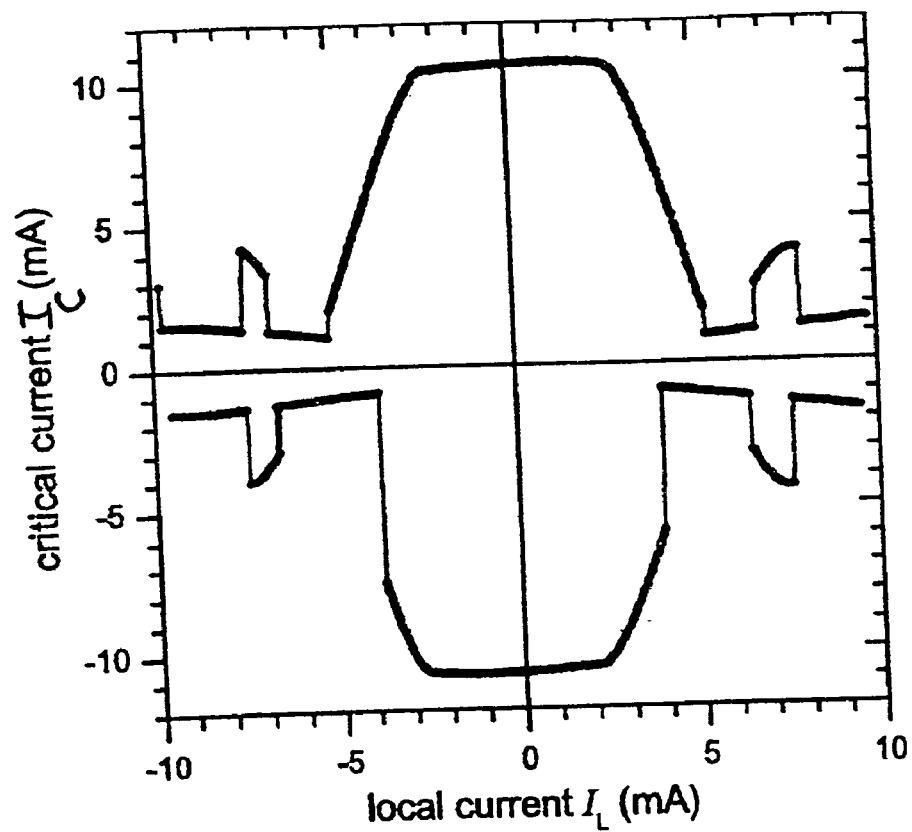
FIG. 11 depicts the effect of local injection current on the critical current.

FIG. 11 depicts the effect of the local injection current on the critical current. The similarity to the conventional Fraunhofer patters noted above is not as pronounced in FIG. 11.

Figure 12:
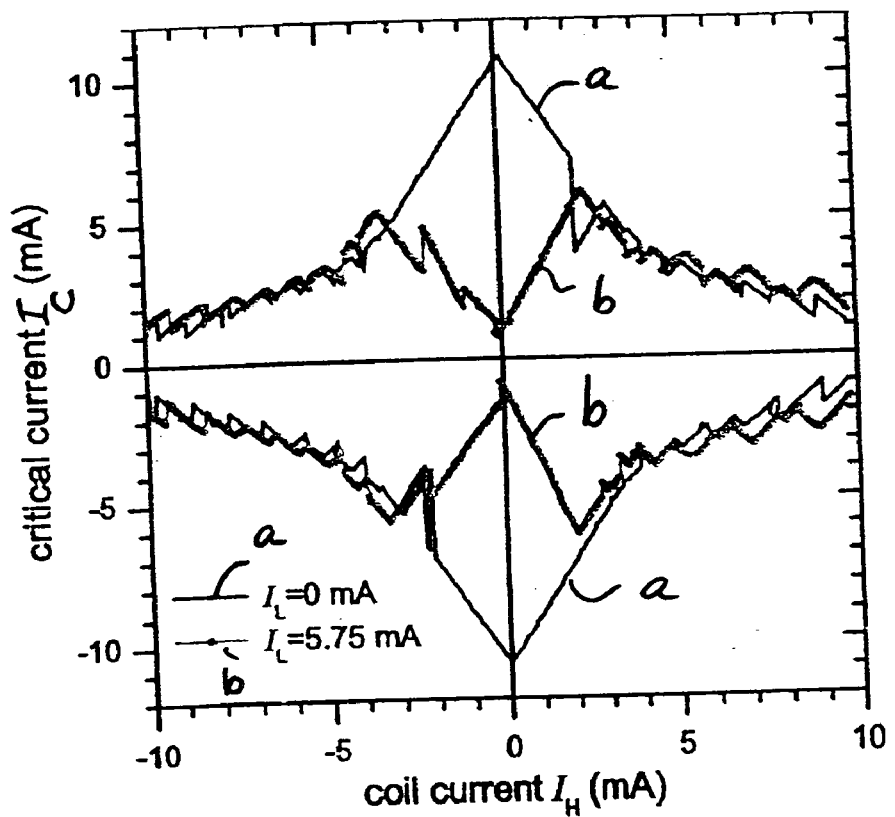
FIG. 12 depicts the dependence of the critical current on the applied magnetic field (applied by means of a coil current $I_H$) for two different values of local current $I_L$.

FIG. 12 depicts the dependence of critical current on the applied magnetic field (as applied by means of a coil current, $I_H$). The pattern for $I_L=0$ is more symmetric than that observed in connection with FIG. 5 above and is the type of functional dependence typical of a long, uniform annular Josephson junction with no trapped fluxons. The curve in FIG. 12 for $I_L=5.75$ mA shows a pronounced minimum around zero applied magnetic field, a typical behavior for one trapped fluxon. For small values of H, a nearly linear increase of $I_c$ with H is observed.

In summary, local current injected by an injection system according to the present invention modulates the critical current of the junction in a manner which is similar to the Fraunhofer pattern. Locally produced magnetic fields act on the junction region between the injection points, which reacts by creating a magnetic field pattern of a small Josephson junction. By choosing the spacing D between the injecting current leads smaller than $\lambda_J$, one can tune the injection current $I_L$ such that the residual fluxon pinning is reduced to a very small level.

Figure 9A:
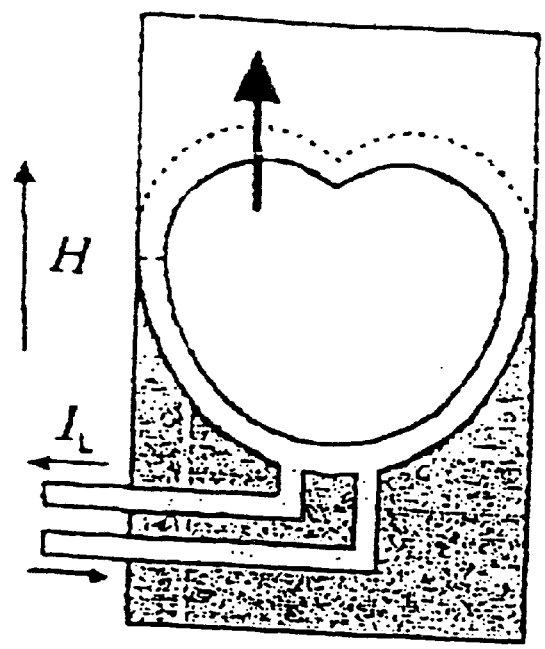
FIG. 9$a$ shows a flux injection system according to the present invention utilizing a heart-shaped junction as for qubit initialization, among other purposes.
Figure 9B:
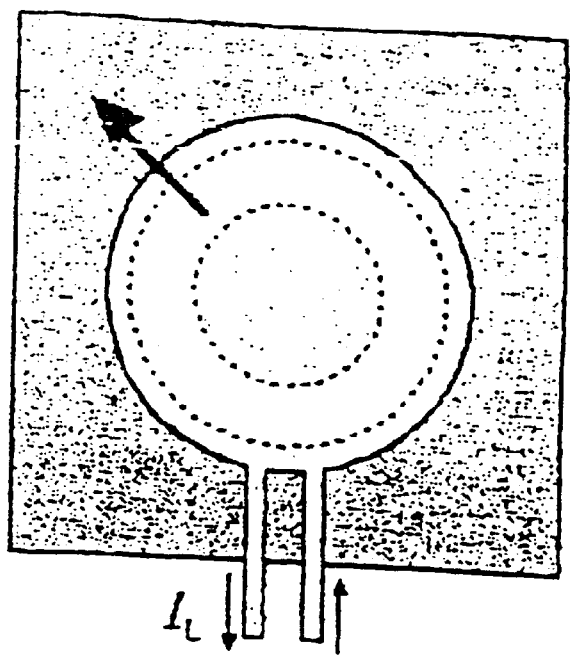

FIGS. 9a and 9b illustrate additional examples of annular junctions with a fluxon injection system according to the present invention. A heart-shaped junction shown in FIG. 9(a) can be used as vortex qubit (see A. Wallraff, Y. Koval, M. Levitchev, M. V. Fistul and A. V. Ustinov, J. Low Temp. Phys. 118, 543 (2000)) when the fluxon quantum state is a superposition of the two lowest energy states in the (upper) lobes of the heart. In this case the junction uniformity is required only for the upper junction region shown in FIG. 9(a), where the fluxon resides. The bottom part of the heart can be comfortably used for preparing the initial state of the qubit, including application of a fluxon injection system.

Applications other than qubits often require a compact, highly symmetric and uniformly biased annular junction with a fluxon trapped in its barrier. A possible layout of such a soliton oscillator or clock is shown in FIG. 9(b). The bias current is to be injected via uniformly distributed thin film resistors (not shown) attached to the superconducting film surrounding the junction. The bias current then flows uniformly through the barrier and is collected via a contact to the ground plane in the center of the ring. It is known that it is nearly impossible to trap a fluxon in such a symmetric structure when cooling down through $T_c$. Therefore, local current injection pursuant to various embodiments of the present invention can be used in this structure as well as in any other, see FIG. 9(b). The same principle can be also applied to the design of radiation and/or particle detectors based on annular junctions (C. Nappi and R. Christiano, Appl. Phys. Lett. 70, 1320 (1997) and M. P. Lisitskii et. al. Nucl. Instr. and Methods in Phys. Research A 444, 476 (2000)). Moreover, the working junction area can be substantially increased as local fluxon injection pursuant to various embodiments of the present invention are expected also to work in larger two dimensional annular junctions, as are typically required for detectors.

The fluxon injection procedures described herein offer the advantage of reversibility not present in conventional fluxon injection techniques. Reducing the injection current to zero causes the fluxon(s) present in the junction to disappear, returning the junction to the fluxon-free state without the necessity of heating the junction above its critical temperature. The junction remains in the fluxon-free state until further injection current is applied sufficient to re-create fluxons. Thus, practical and convenient resetting of the junction to the state of zero fluxons is accomplished.

In conclusion, fluxon injection systems have been described herein and demonstrated both experimentally and numerically. Such fluxon injection systems allow for trapping, retaining and removing any desired number of fluxons to, within or from the junction. Fluxon injection systems according to the present invention substantially simplify the use of annular junctions as oscillators, radiation detectors, vortex qubits among other applications.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

I claim:

1. A method of injecting at least one fluxon into an annular Josephson junction comprising:

providing current carrying injection electrodes electrically connected to a superconducting electrode of the annular Josephson junction; and, delivering an injection current through the injection electrodes wherein the injection current has sufficient magnitude that the magnetic flux generated in the junction of the Josephson junction by the passage of the injection current therethrough is sufficient to create at least one fluxon in the Josephson junction.

2. The method of claim 1, wherein the magnetic flux generated by the injection current is at least twice the quantum of magnetic flux.

3. The method of claim 1, wherein the annular Josephson junction is a long Josephson junction.

4. The method of claim 1, wherein the annular Josephson junction is substantially circular in shape.

5. The method of claim 1, wherein the annular Josephson junction is heart-shaped.

6. The method of claim 1, wherein the annular Josephson junction has a Lyngby geometry.

7. The method of claim 1, wherein the annular Josephson junction comprises Nb/Al—AlO$_x$/Nb.

8. The method of claim 7, wherein the annular Josephson junction has a mean diameter of approximately 100 µm and a junction width of approximately 4 µm.

9. The method of claim 8, wherein a spacing between the injection electrodes is in a range from approximately 10 µm to approximately 22 µm.

10. The method of claim 9, wherein the injection current is between approximately 3 mA to approximately 10 mA.

11. A fluxon as an article of manufacture wherein the fluxon is produced according to the process of claim 1.

12. A plurality of fluxons produced according to the process of claim 1.

13. The method of claim 1, wherein a spacing between the injection electrodes is in a range from approximately a value of the Josephson penetration depth to approximately a width of the current injection leads.

14. The method of claim 1, wherein the annular Josephson junction forms a qubit.

15. A method of creating and destroying fluxons in a Josephson junction comprising:

provide current carrying injection electrodes electrically connected to a superconducting electrode of the Josephson junction; and, delivering an injection current through the injection electrodes wherein the injection current has sufficient magnitude that the magnetic flux generated in the junction of the Josephson junction by the passage of the injection current therethrough is sufficient to create at least one fluxon in the Josephson junction; and reducing the injection current to zero thereby returning the Josephson junction to a state without fluxons.

16. The method of claim 15, wherein the magnetic flux generated by the injection current is at least twice the quantum of magnetic flux.

17. The method of claim 15, wherein the annular Josephson junction is a long Josephson junction.

18. The method of claim 15, wherein the annular Josephson junction is substantially circular in shape.

19. The method of claim 15, wherein the annular Josephson junction is heart-shaped.

20. The method of claim 15, wherein the annular Josephson junction has a Lyngby geometry.

21. The method of claim 15, wherein spacing between the injection electrodes is in a range from approximately a value of the Josephson penetration depth to approximately a width of the current injection leads.

22. The method of claim 15, wherein the annular Josephson junction forms a qubit.

* * * * *

UNITED STATES PATENT AND TRADEMARK OFFICE
CERTIFICATE OF CORRECTION

PATENT NO. : 6,728,131 B2
DATED : April 27, 2004
INVENTOR(S) : Ustinov

It is certified that error appears in the above-identified patent and that said Letters Patent is hereby corrected as shown below:

Title page,
Item [54], Title, please insert -- METHODS FOR -- at the beginning of the title, before "FLUXON."

Signed and Sealed this

Thirteenth Day of July, 2004

JON W. DUDAS
*Acting Director of the United States Patent and Trademark Office*